United States Patent [19]
Gregory

[11] Patent Number: 5,931,032
[45] Date of Patent: Aug. 3, 1999

[54] CUTTER AND BLOW RESISTANT LOCK

[76] Inventor: Edwin H. Gregory, 712 Arkansas Ave., Mountain Home, Ark. 72653

[21] Appl. No.: 09/061,700

[22] Filed: Apr. 16, 1998

[51] Int. Cl.$^6$ ..................................................... E05B 65/06
[52] U.S. Cl. ................................. 70/129; 70/56; 292/148
[58] Field of Search ................................. 70/54–56, 2, 6, 70/11, 39, 32–34, 129, 134, 451; 292/57, 148

[56] References Cited

U.S. PATENT DOCUMENTS

| | | | |
|---|---|---|---|
| 1,755,935 | 4/1930 | Roberts | 70/129 X |
| 2,468,406 | 4/1949 | Mora | 70/129 |
| 2,482,341 | 9/1949 | Holmsten | 292/148 |
| 2,660,872 | 12/1953 | Beach | 70/32 |
| 2,722,819 | 11/1955 | Holmsten | 70/129 |
| 2,974,987 | 3/1961 | O'Brien | 292/148 |
| 4,095,828 | 6/1978 | East | 292/148 |
| 4,229,956 | 10/1980 | Thorburn | 70/129 |
| 4,234,220 | 11/1980 | Finch et al. | 292/148 |
| 4,613,175 | 9/1986 | Nelson | 70/56 X |
| 4,641,506 | 2/1987 | Boucher | 70/129 |
| 4,802,351 | 2/1989 | Kojak | 70/56 |
| 4,884,421 | 12/1989 | Lindsay | 292/148 X |
| 4,911,486 | 3/1990 | Anderson | 292/148 |
| 4,932,692 | 6/1990 | Nelson | 292/148 |
| 5,000,494 | 3/1991 | Guibleo | 292/148 |
| 5,261,258 | 11/1993 | Bunger | 70/56 |
| 5,315,850 | 5/1994 | Edeus et al. | 70/129 |
| 5,404,734 | 4/1995 | Martinez | 70/34 |
| 5,458,383 | 10/1995 | Gunn | 292/148 |
| 5,518,281 | 5/1996 | Steward | 292/148 X |
| 5,547,236 | 8/1996 | Gregory | 292/148 |
| 5,588,314 | 12/1996 | Knezovich | 292/148 X |

*Primary Examiner*—Suzanne Dino Barrett
*Attorney, Agent, or Firm*—Head, Johnson & Kachigian

[57] ABSTRACT

A lock comprising an elongated, parallelepiped housing with an internal sliding latch with a centrally located shackle pin that is selectively secured with a tumbler casing to immobilize the latch to secure a door. The housing comprises a base that is affixed to the door and a faceplate set-off from the base by an integral top and parallel bottom. The top, bottom, faceplate and base establish a channel in which the latch moves. The latch comprises a planar body with spaced apart ends. One end comprises a bolt that inserts into a conventional keeper secured to the facility wall. The other latch end comprises an outwardly protruding handle that facilitates user manipulation. A pair of spaced apart slots are defined proximate the latch ends to permit the mounting bolts to extend through the latch and an oval-shaped slot defined adjacent the latch center permits a shackle pin to extend therethrough. The shackle pin secures a removable tumbler casing that immobilizes the sliding latch. The tumbler casing comprises an oval periphery tightly received by a central faceplate groove and the latch slot so that blows upon the casing are transferred to the housing. The pin permits casing rotation thereabout. When the removable tumbler casing is selectively inserted into the faceplate groove and central latch slot, it receives the shackle pin to immobilize the latch. After the tumbler casing is removed, the user may slide the latch to remove the bolt from the keeper to release the door. An optional secondary authorization system may be used to permit a landlord or the like to regulate entry as well.

12 Claims, 3 Drawing Sheets

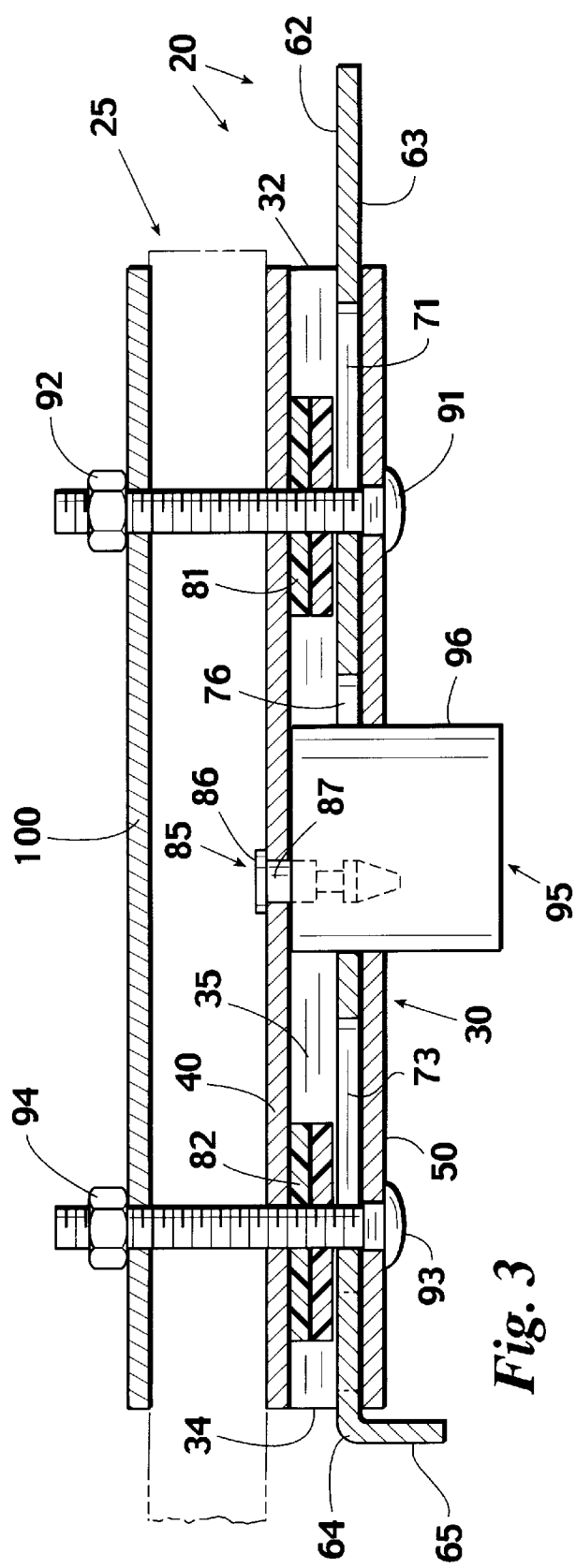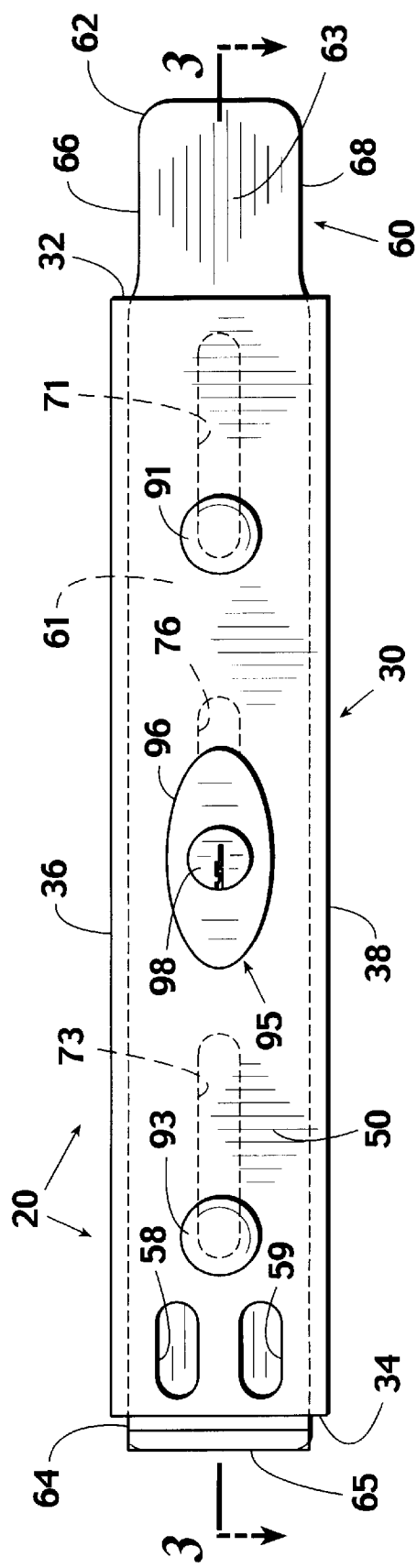

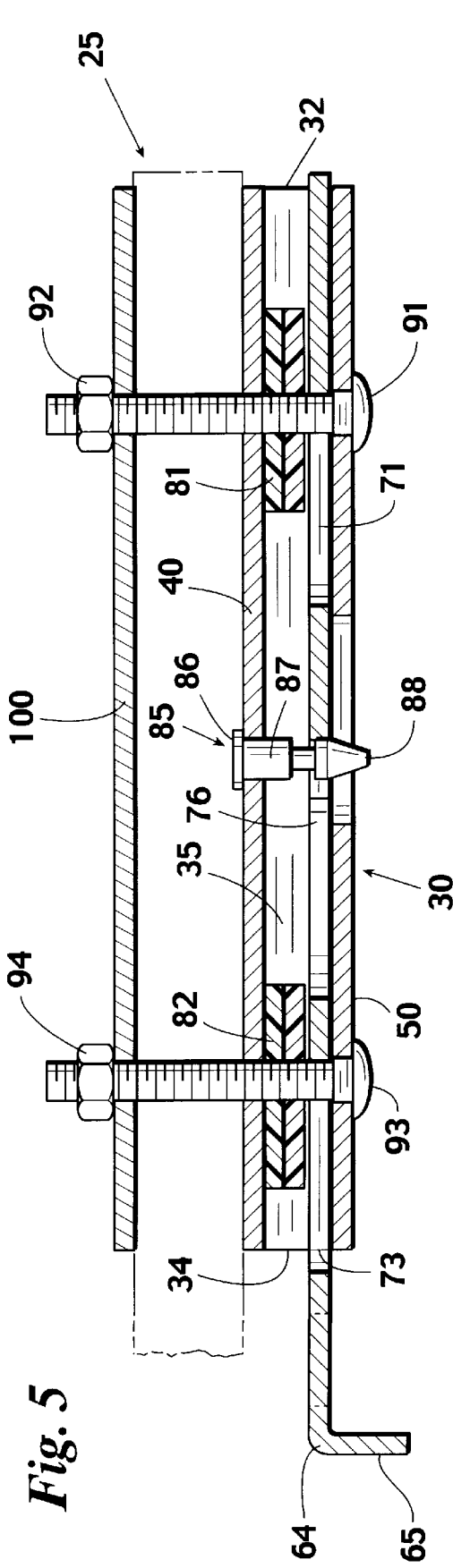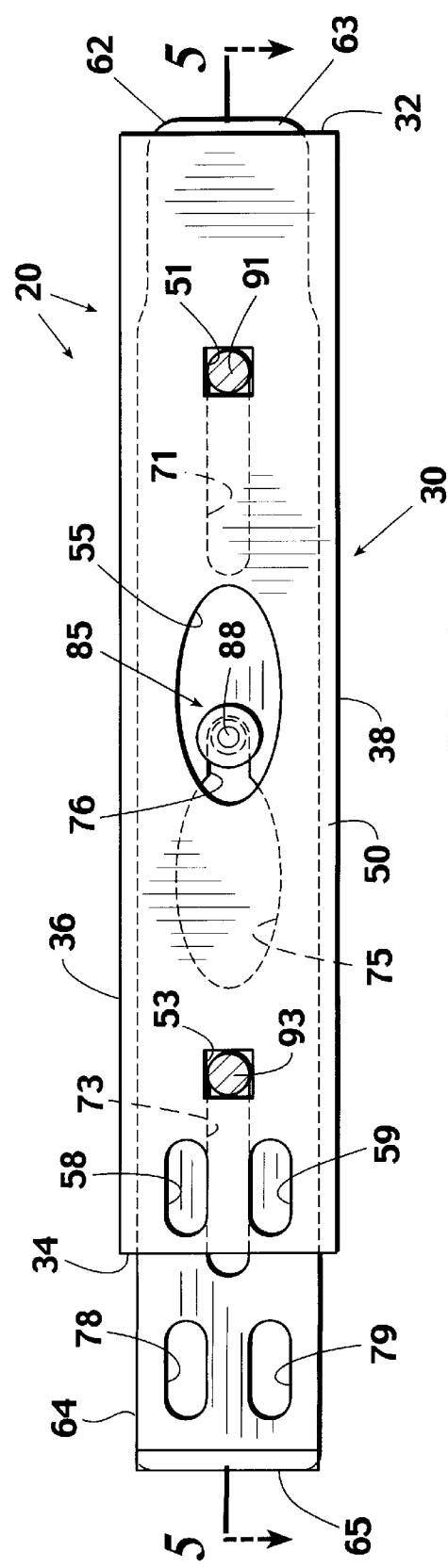

CUTTER AND BLOW RESISTANT LOCK

BACKGROUND OF THE INVENTION

1. Field of the Invention

This invention relates generally to locks. More particularly, this invention relates to locks that resist various destructive entry techniques such as shackle cutting or forcible blows and that are suitable for unguarded areas such as deserted storage facilities and the like. Known related art can be found in U.S. Classes 70, 292 and the related subclasses thereunder.

2. Description of Prior Art

As will be appreciated by those skilled in the art, the use of rented storage by society has grown tremendously during recent years, especially in large cities. A particularly popular enterprise comprises a large facility with several discrete temporary storage units that are individually leased to members of the general public. Each discrete storage unit typically comprises a single room accessed through a central door. Many municipalities have zoned or otherwise required such storage facilities to locate in industrialized sections or other areas that are often deserted or unattended at night. As a result, security at such facilities is often problematic.

While access to the facility as a whole may or may not be restricted in some manner, the individual renter is typically responsible for securing their rental unit against unauthorized entry. Since the doors on such storage units are often the only convenient entryways, most renters simply place a conventional padlock on the door to prevent unauthorized trespass or theft.

Unfortunately, unauthorized trespassers have discovered methods of disabling conventional padlocks. A favorite tactic of these dastardly villains is to use a bolt cutter, hack saw or another similar tool to cut through the exposed padlock shackles. Another favorite tactic is to forcibly strike the padlock housing with a large hammer or other blunt object to rip the shackles from the lock housing. Both of these practices of disabling padlocks are aided by the remote, deserted nature and lack of surveillance associated with many storage facilities.

Several prior art devices have been proposed to overcome the shortcomings associated with conventional padlocks on storage units. For example, U.S. Pat. No. 4,234,220 to Finch et al., shows an interesting lock wherein a conventional key lock case is inserted through an opening to engage at least two lugs. When the lock case is in the locking position, it prevents the bolt from moving to the left, thus maintaining the door in the locked position.

Another interesting example is shown in U.S. Pat. No. 5,404,734 to Martinez. The patent shows a specially designed lock case with an opening therethrough adapted to receive a bolt or other bar member having circular holes engaged by the internal mechanism in the lock body.

Yet another interesting example is shown in U.S. Pat. No. 4,802,351. This lock appears to employ a generally conventional lock case that blocks the end of a bolt. U.S. Pat. No. 2,974,987 to O'Brien also appears to use a generally conventional lock case to obstruct the motion of a sliding bolt. However, the lock case is received in and slides with the bolt and the case is arranged in a vertical position. Other prior art examples of general relevance can be seen in U.S. Pat. Nos. 2,722,819, 4,641,506 and 5,315,850.

However, none of the known prior art fails to provide acceptably tamper and/or cutter resistant locks that reliably preserve the integrity of remote doors. In particular, the known prior art fails to provide an apparatus that redundantly resists multiple types of destructive forces such as cutting instruments combined and/or forcible blunt blows.

Thus, a desirable improvement to the art would be a multiple redundancy lock that prevented unauthorized persons from disabling the lock by severing its shackles. Another desirable improvement would be a lock that transmitted forcible blows upon the tumbler housing directly to the door. Preferably, such a lock would adeptly deflect such forces from the pin by pivoting thereabout. An even more desirable lock would preserve the integrity of the door by preventing shackle severing and withstanding forcible blows. A desirable attribute of such an improved lock would be its increased durability and the increased integrity of the unit security.

Another desirable attribute of an improved lock would be an enclosed housing that prevented thieves from accessing the lock shackle(s) and/or mounting anchors that secure the lock to the door. Thus, thieves would be prevented from cutting the shackles or simply removing the lock from the door to gain access therein. Of course, an improved lock should be relatively simple to install with minimal tools and/or instructions.

Preferably, an improved lock could be retrofitted to existing storage unit doors to maximize the utility of existing structures without completely reinstalling the doors. As a consequence, the renter or owner would need only to remove the preexisting lock and install the improved lock to secure the facility.

SUMMARY OF THE INVENTION

My improved lock overcomes the above perceived problems associated with the known prior art by eliminating weaknesses at critical junctures commonly attacked by thieves. The lock prevents thieves from gaining access to restricted areas and may be easily retrofitted to existing doors. In its preferred embodiment, the lock may be easily installed by persons with minimal experience and/or instruction.

The improved lock comprises an elongated, parallelepiped housing with an internal sliding latch. A conventional shackle disposed in the housing selectively receives a conventional tumbler inserted in the housing to thereby immobilize the latch and secure the door.

The housing comprises a base that is preferably directly affixed to the door. The base may be secured with conventional mounting hardware such as screws or bolts and may utilize an optional anchor plate to increase the surface area of the mount on the door. Preferably, a faceplate is spaced apart from the base by an integral top parallel to and spaced from an integral bottom. The top, bottom, faceplate and base establish a channel with a roughly rectangular cross-section.

The sliding latch normally resides in the housing and slides in the channel during user manipulation. The latch comprises an elongated planar body with spaced apart ends. Preferably, the sliding latch is slightly dimensionally smaller than the housing so that the latch fits tightly therein. One latch end comprises a bolt that is selectively inserted into a conventional keeper secured to the facility wall by a user. When the bolt is inserted into the keeper, the latch securely immobilizes the door to prevent entry therein. The other latch end comprises an outwardly turned flanged handle that facilitates user manipulation of the latch when sliding the latch to insert or remove the bolt from the keeper. Several slots are defined along the latch length. A pair of spaced apart slots defined proximate the latch ends to permit the mounting bolts to extend through the latch while a larger, centrally located, oval-shaped slot defined adjacent the latch center enables a central shackle pin to extend therethrough.

The shackle secures a removable tumbler casing that immobilizes the sliding latch. Preferably, the shackle comprises a single central pin of conventional shape. The pin extends outwardly from the housing base into a corresponding slot in the latch that permits the shackle pin to extend above the plane established by the latch.

The removable tumbler casing comprises a conventional internal tumbler that is actuated by a conventional key through a keyway. When the removable tumbler casing is inserted into the grooves of the housing faceplate and the central slot of the latch to abut the housing base, it receives the shackle pin to immobilize the latch. When the tumbler casing is removed, the user may slide the latch to remove the bolt from the keeper to release the door.

An optional secondary authorization system may be used to permit a landlord or the like to regulate entry as well. The authorization system comprises a pair of spaced apart auxiliary slots defined in the faceplate with corresponding auxiliary slots in the latch adjacent the handle. The auxiliary slots permit the landlord to insert a conventional padlock on the latch to prevent unauthorized entry. In this manner, the landlord may insure that rent is timely paid when the lock is installed upon a storage facility or the like. Of course, the secondary system that employs a conventional padlock is not cutter resistant by itself, but thieves only removing the conventional lock would still have to overcome the primary improved lock.

Thus, the housing protects both the sliding latch and the shackle by preventing unrestricted access thereto. As a consequence, thieves are prevented from cutting the lock shackles or latch to breech the protected facility. Also, the preferred tumbler casing comprises an oval periphery that is tightly received by a central groove in the housing faceplate when the tumbler is in use. Preferably, the latch slot also tightly receives the tumbler casing during use. As a consequence of these snug fits, blows upon the casing are transferred to the housing directly and through the latch as well. Also, the single central shackle pin encourages the tumbler casing to rotate when struck by most forcible blows to further transfer the blow to the housing. Thus, the destructive blows delivered to the tumbler are dissipated while maintaining the integrity of the lock.

Thus, it is an object of the present invention to provide an improved lock that resists destructive cutting by preventing unauthorized access to immobilizing portions of the lock.

Another basic object of the present invention is to provide a lock that resists forcible blows.

Another object of the present invention is to provide a lock that resists unauthorized breaches of a facility by shrouding the shackle pin and restricting access to the immobilizing latch.

Yet another object of the present invention is to provide a lock that dissipates destructive blows upon the tumbler casing.

A related object of the invention is to provide a central shackle pin that encourages casing rotation when struck by a forcible blow to further dissipate the blow.

A basic object of the present invention is to provide a lock that preserves latch integrity by preventing unrestricted access thereto.

A related object of the present invention is to provide a lock that may be used in remote locations without extensive supervision.

Yet another object of the invention is to provide a lock that may be retrofitted to existing doors.

A related object of the present invention is to provide a retrofittable lock that may be installed with minimal instruction and tools.

BRIEF DESCRIPTION OF THE SEVERAL VIEWS OF THE DRAWING

FIG. 2 is a top plan view thereof, with the dashed lines representing the outline of the sliding latch, with the tumbler casing inserted upon the shackle pin to immobilize the latch;

FIG. 3 is a cross-sectional view taken along line 3—3 of FIG. 2, with the tumbler casing inserted upon the shackle pin to immobilize the latch;

FIG. 4 is a top plan view similar to FIG. 2, but showing the sliding latch in the moved, open position with the tumbler casing removed therefrom; and, FIG. 5 is a cross-section view taken along lines 5—5 of FIG. 4.

DETAILED DESCRIPTION OF THE INVENTION

Figure 1:
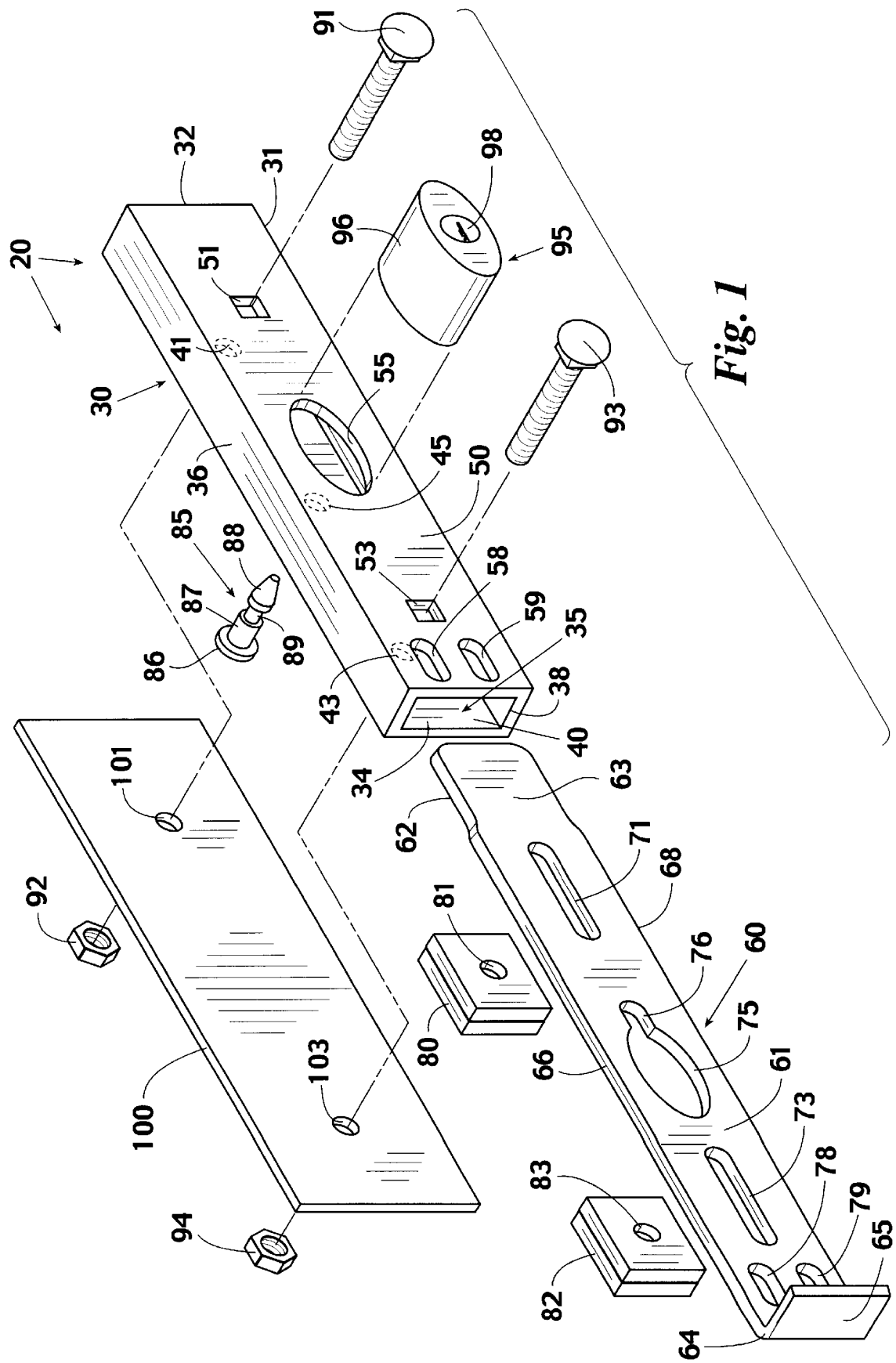
FIG. 1 is an exploded isometric view of a preferred embodiment of my invention.

My improved cutter and blow resistant lock is generally designated by reference numeral 20 in FIGS. 1–5. The improved lock is adapted to be installed upon a remote storage facility door 25 or similar structure to secure the opening thereto. The lock 20 selectively immobilizes door 25 to prevent unauthorized entry. The lock 20 comprises a housing 30 with an internal, sliding latch 60 that may be selectively immobilized by the insertion of a tumbler casing 95 onto a shackle 85 in housing 30.

Housing 30 preferably comprises an elongated, parallelepiped frame 31. Frame 31 comprises spaced apart, open ends 32 and 34. An elongated top 36 extends parallel to an elongated bottom 38 to set off the rear base 40 from the front faceplate 50. Preferably, the top 36 and bottom 38 integrally join the faceplate 40 to the faceplate 50. The top 36, bottom 38, base 40 and faceplate 50 comparatively define an elongated channel 35 extending between open ends 32, 34. Preferably, channel 35 defines a rectangular cross-section.

Housing 30 preferably measures 12 inches in length by 4 inches in height by 1 inch in thickness. Housing 30 may be manufactured from various types of metal, but for strength and durability, steel is the preferred construction material base 40 preferably comprises an elongated planar sheet to maximize surface contact with door 25. Preferably, base 40 defines two holes 41 and 43 proximate ends 32 and 34 respectively. Faceplate 50 preferably comprises an elongated planar sheet similar to base 40. A square hole 51 corresponds to hole 41 while another square hole 53 corresponds to hole 43. A larger centrally located, oval shaped groove 55 is concentrically aligned with hole 45. Two axillary locking slots 58,59 are also defined in faceplate 50 adjacent end 34.

Sliding latch 60 comprises a elongated bar 61 with spaced apart ends 62 and 64. End 62 forms an integral bolt 63 that is preferably slightly tapered for insertion into a conventional keeper on the facility wall. The other end 64 forms a handle for user manipulation. Preferably end 64 projects perpendicularly to the longitudinal axis of bar 61 to form a terminal handle 65.

Bar 61 is preferably formed of the same material as housing 30. Bar 61 further comprises a top 66 and bottom 68 spaced apart from one another and extending between ends 62 and 64. Several slots are defined along the length of bar 61. An elongated oval shaped slot 71 is defined proximate end 62 while another elongated oval shaped slot 73 is defined proximate end 64. A larger, central slot 75 with a peripheral recess 76 defined adjacent thereto is located intermediate the smaller slots 71 and 73. Preferably, a pair of auxiliary locking slots 78 and 79 are defined between slot 73 and end 64. These locking slots define an auxiliary locking means for immobilizing the latch. The slots including a pair of spaced apart orifices in said faceplate that align with spaced apart orifices in said latch to permit a conventional lock to be inserted thereabout.

When the lock 20 is assembled, bar 61 slides in channel 35 where it is appropriately positioned by spacers 80 and 82. Spacer 80 is centrally penetrated by hole 81 while spacer 82 is similarly penetrated by a central hole 83. When the bar 61 is inserted in channel 35 and spacers 80, 82 are properly aligned, the holes 41, 51, 81 and sot 71 are aligned adjacent end 32 while holes 43, 53, 83 and slot 73 are also aligned adjacent end 34. Thus, when the lock 20 is installed upon a door (i.e., 25) a pair of conventional carriage bolts 91, 93 (preferably ¾"×½") may be inserted through holes 41, 51, 81 and slot 71 and holes 43, 53 and 83 and slot 73 to secure the lock 20 to the door 25. Bolts 91, 93 are secured with nuts 92, 94. An optional anchor plate 100 may also be used on the interior surface of the door to further stabilize lock 20. Plate 100 comprises an elongated plate defining holes 101 and 103 that receive bolts 91 and 93 respectively. When installed, lock 20 is securely affixed to the door 25 to prevent its subsequent removal therefrom.

A shackle 85 inserts through hole 45 during lock installation to reside in groove 55 and slot 75. In the preferred embodiment, the shackle 85 takes the form of a solitary central pin having a conventional shape for subsequent conventional tumbler operations. However, other shapes may be employed so long as an adequate locking configuration can be established. In the preferred embodiment, shackle pin 85 comprises a base 86 that is substantially larger then hole 45 and a main shaft 87 that is slightly smaller then the same diameter as hole 45. A nose 88 facilitates pin insertion through hole 45 and into casing 95 while a recess core 89 permits conventional locking about pin 85.

A removable tumbler casing 95, which comprises a conventional internal tumbler (not shown) selectively immobilizes the latch 60. When the tumbler housing 95 is secured to the shackle pin 85, the periphery of the tumbler casing 96 is snugly secured within the interior periphery of slot 75 and groove 55. A key hole 98 permits the insertion of a key into the casing 95 for its removal from shackle pin 85.

In use (FIGS. 2–3), lock 20 selectively immobilizes a door 25 or other gate type opening. The tumbler casing 95 is selectively inserted through groove 55 and slot 75 to abut base 40. When so inserted, casing 95 receives the protruding shackle pin 85 to immobilize latch 60 (FIG. 3). As mentioned previously, casing 95 preferably contains a conventional tumbler that receives and selectively retains pin 85 in a conventional locking configuration. To remove the tumbler casing 95 and release the pin 85, the user simply inserts the conventional key in the conventional manner. When the tumbler casing 95 is removed, latch 60 may be freely moved to the open position shown in FIGS. 4 and 5. Recess 76 and slots 71 and 73 permit the bar 61 to slide from the immobilizing position to the open position.

When the tumbler casing 95 is in place and the door is locked, any blows on casing 95 are preferably transferred directly to the latch 60 and housing 30 and then to the door 25. In the preferred embodiment, the single central shackle pin 85 encourages the casing 95 to rotate about the pin 85 when struck by glancing or other blows not centered on pin 85, further facilitating dissipation of the blow. Of course, housing 30 prevents unauthorized, unrestricted access to latch 60 to prevent the cutting of latch bar 61 or the shackle pin 85 to unlock door 25. Thus, vandals and thieves are deprived of their favorite entry tactics.

The lock 20 may be easily retrofitted to existing doors by appropriately locating the housing 30 on the door exterior and drilling the necessary holes. Preferably, the lock 20 replaces the existing latch assembly on the retrofitted door.

Whereas, the present invention has been described in relation to the drawings attached hereto, it should be understood that other and further modifications, apart from those shown or suggested herein, may be made within the spirit and scope of this invention.

What is claimed is:

1. A cutter and blow resistant lock for a door in a frame adapted to engage with a bolt of said lock, said lock comprising:

a housing with a base and a spaced apart faceplate, said base adapted to secure said housing to said door;

a latch adapted to slide in said housing, said latch having a slot for receiving said tumbler casing and said latch having two spaced apart ends, one of said ends having a handle for user manipulation and the other of said ends having a bolt adapted to engage said frame to lock said door;

a shackle extending outwardly from said base through said latch and said faceplate; and, a removable casing containing a tumbler adapted to be inserted upon said shackle to engage and immobilize said latch to lock said door and wherein said shackle is shaped to be secured in or released from said tumbler casing by operation of said tumbler.

2. The lock as defined in claim 1 wherein said faceplate further comprises a groove for receiving said tumbler casing.

3. The lock as defined in claim 2 wherein said latch slides between an open position wherein said slot and said groove are unaligned and a closed position wherein said slot and said groove are aligned to receive said tumbler casing to facilitate tumbler insertion upon said shackle.

4. The lock as defined in claim 1 wherein said shackle comprises a pin and wherein said tumbler casing is adapted to rotate about said pin.

5. The lock as defined in claim 1 further comprising auxiliary locking means for immobilizing said latch, said auxiliary means comprising a pair of spaced apart orifices in said faceplate that align with spaced apart orifices in said latch to permit a conventional lock to be inserted thereabout.

6. The lock as defined in claim 1 wherein at least two bolts penetrate said housing to secure said housing to said door and wherein at least one of said bolts penetrates said housing proximate said handle and at least one of said bolts penetrates said housing proximate said bolt.

7. A cutter and blow resistant lock for a door in a frame adapted to engage with a bolt of said lock, said lock comprising:

a housing with a base and a spaced apart faceplate, said base adapted to secure said housing to said door;

a latch adapted to slide in said housing, said latch having two spaced apart ends, one of said ends having a handle for user manipulation and the other of said ends having a bolt adapted to engage said frame to lock said door;

a shackle extending outwardly from said base through said latch and said faceplate;

a removable casing containing a tumbler adapted to be inserted upon said shackle to engage and immobilize said latch to lock said door and wherein said shackle is shaped to be secured in or released from said tumbler casing by operation of said tumbler; and, wherein said latch further comprises a slot for receiving said tumbler casing and wherein said faceplate further comprises a groove for receiving said tumbler casing and wherein said latch slides between an open position wherein said slot and said groove are unaligned and a closed position wherein said slot and said groove are aligned to receive said tumbler casing to facilitate tumbler insertion upon said shackle.

8. The lock as defined in claim 7 wherein said shackle comprises a pin and wherein said casing is adapted to rotate about said pin.

9. The lock as defined in claim 7 further comprising auxiliary locking means for immobilizing said latch, said auxiliary means comprising a pair of spaced apart orifices in said faceplate that align with spaced apart orifices in said latch to permit a conventional lock to be inserted thereabout.

10. The lock as defined in claim 8 wherein at least two bolts penetrate said housing to secure said housing to said door and wherein at least one of said bolts penetrates said housing proximate said handle and at least one of said bolts penetrates said housing proximate said bolt.

11. A cutter and blow resistant lock for a door in a frame adapted to engage with a bolt of said lock, said lock comprising:

a housing with a base and a spaced apart faceplate extending between spaced apart ends to form an internal channel, said base adapted to secure said housing to said door and wherein at least one bolt penetrates said base adjacent each of said spaced apart ends;

a latch adapted to slide in said channel, said latch having two spaced apart ends, one of said latch ends having a handle for user manipulation and the other of said latch ends having a bolt adapted to engage said frame to lock said door;

a shackle pin extending from said base through said latch and said faceplate;

a removable casing containing a tumbler adapted to be inserted upon said shackle to engage and immobilize said latch to lock said door and wherein said shackle is shaped to be secured in or released from said tumbler casing by operation of said tumbler and wherein said casing is adapted to rotate about said pin; and, wherein said latch further comprises a slot for receiving said tumbler casing and wherein said faceplate further comprises a groove for receiving said tumbler casing and wherein said latch slides between an open position wherein said slot and said groove are unaligned and a closed position wherein said slot and said groove are aligned to receive said tumbler casing to facilitate tumbler insertion upon said shackle.

12. The lock as defined in claim 9 further comprising auxiliary locking means for immobilizing said latch, said auxiliary means comprising a pair of spaced apart orifices in said faceplate that align with spaced apart orifices in said latch to permit a conventional lock to be inserted thereabout.

* * * * *